United States Patent
Francis et al.

(10) Patent No.: US 12,309,959 B2
(45) Date of Patent: May 20, 2025

(54) SECURED, SUB-RACK NETWORK RACK BUILDING BLOCK

(71) Applicant: Google LLC, Mountain View, CA (US)

(72) Inventors: Zachariah Gregory Francis, Thornton, CO (US); Bodie William Francis, Arvada, CO (US); Devin Richard Kennedy, Boston, MA (US); Nicola Andrew Foggi, Ashburn, VA (US)

(73) Assignee: Google LLC, Mountain View, CA (US)

( * ) Notice: Subject to any disclaimer, the term of this patent is extended or adjusted under 35 U.S.C. 154(b) by 316 days.

(21) Appl. No.: 17/854,974

(22) Filed: Jun. 30, 2022

(65) Prior Publication Data

US 2023/0019487 A1  Jan. 19, 2023

Related U.S. Application Data

(60) Provisional application No. 63/222,554, filed on Jul. 16, 2021.

(51) Int. Cl.
| | |
|---|---|
| *H05K 7/14* | (2006.01) |
| *G07C 9/20* | (2020.01) |
| *H05K 7/18* | (2006.01) |

(52) U.S. Cl.
CPC ............ *H05K 7/1489* (2013.01); *G07C 9/20* (2020.01); *H05K 7/1488* (2013.01); *H05K 7/1495* (2013.01); *H05K 7/183* (2013.01)

(58) Field of Classification Search
None
See application file for complete search history.

(56) References Cited

U.S. PATENT DOCUMENTS

| | | | |
|---|---|---|---|
| 9,392,733 B2 | 7/2016 | Day | |
| 9,750,157 B1 * | 8/2017 | Mehta | H05K 5/0226 |
| 10,485,120 B1 | 11/2019 | Adams et al. | |
| 10,863,646 B1 * | 12/2020 | Rampey | A47B 61/02 |
| 2001/0011314 A1 * | 8/2001 | Gallagher | G06F 9/4406 |
| | | | 710/302 |

(Continued)

FOREIGN PATENT DOCUMENTS

| | | |
|---|---|---|
| CN | 105916320 B | 7/2018 |
| EP | 1229775 A2 | 8/2002 |

(Continued)

OTHER PUBLICATIONS

Extended European Search Report for European Patent Application No. 22185308.8 dated Jan. 2, 2023. 7 pages.

*Primary Examiner* — James Wu
*Assistant Examiner* — Christopher L Augustin
(74) *Attorney, Agent, or Firm* — Lerner David LLP (57) ABSTRACT

A cargo rack is usable to store electronic devices, such as servers, while the electronic devices operate. The cargo rack has a telescoping enclosure with one or two doors for selectively closing either or both ends of the enclosure. The cargo rack also includes an onboard electronic system. The electronic system includes a programmable controller and an access control system for selectively locking or unlocking the door or doors of the enclosure. The access control system includes a security interface at which access credentials may be presented from outside the enclosure for recognition by electronics within the enclosure.

20 Claims, 9 Drawing Sheets

(56) References Cited

U.S. PATENT DOCUMENTS

| | | | |
|---|---|---|---|
| 2004/0080244 A1* | 4/2004 | Lowther, Jr. | A47B 57/10 312/223.1 |
| 2007/0144980 A1 | 6/2007 | Nguyen | |
| 2019/0174651 A1* | 6/2019 | Crawford | H05K 7/20836 |

FOREIGN PATENT DOCUMENTS

| | | | |
|---|---|---|---|
| WO | 2016137731 A1 | 9/2016 | |
| WO | 2019014775 A1 | 1/2019 | |
| WO | 2019226574 A1 | 11/2019 | |

\* cited by examiner

SECURED, SUB-RACK NETWORK RACK BUILDING BLOCK

CROSS REFERENCE TO RELATED APPLICATION

The present application claims the benefit of the filing date of U.S. Provisional Patent Application No. 63/222,554 filed Jul. 16, 2021, the disclosure of which is hereby incorporated herein by reference.

BACKGROUND

Servers and other remote hardware such as may be used in, for example, edge computing are usually operated in data centers or similar storage spaces. Multiple customers or partners may store equipment in the same room. Rooms in such spaces are typically divided only by tall vertical cabinets, meaning an entire cabinet and the floor space the cabinet occupies are the smallest possible unit that can be devoted to a given customer. As a result, when some customers need less than an entire cabinet, some cabinets will hold wasted vertical space. This wastage has become more common as computer hardware has become more compact.

Security in known storage spaces is also at the level of the cabinet or, in some instances, the entire room. Customers may therefore have little freedom in choosing the security measures applied to their hardware, and facility operators may face significant expenses in retrofitting large spaces for new technology.

For these reasons, greater divisibility in computer hardware storage may be more efficient for customers and facility operators.

BRIEF SUMMARY

Aspects of this disclosure are directed to a cargo rack which may be used to store electronic devices, such as servers, while the electronic devices operate. The cargo rack may have a telescoping enclosure. The telescoping enclosure may include at least two hulls, with an inner hull being partially received in an outer hull. The cargo rack may further include a rail system for guiding telescoping movement of the hulls relative to one another. The enclosure may further include one or two doors for selectively closing either or both ends of the enclosure.

The cargo rack may also include an onboard electronic system. The electronic system may include a power outlet for the enclosed computer hardware. The electronic system may also include an access control system for selectively locking or unlocking the door or doors of the enclosure. The access control system may include a security interface at which access credentials may be presented from outside the enclosure for recognition by electronics within the enclosure.

In another aspect, a telescopic server cargo rack may include an enclosure and an electronic system. The enclosure may include an inner hull and an outer hull in which an end of the inner hull is telescopically received. The enclosure may also include a door closing an end of the enclosure. The electronic system may be mounted within the enclosure and including a power outlet.

In another arrangement according to any of the foregoing, the electronic system may further include an access control system that selectively locks or unlocks the door.

In arrangement according to any of the foregoing, the access control system may further include a security interface integrated with the door and through which access credentials may be presented to prompt the access control system to unlock the door.

In another arrangement according to any of the foregoing, the security interface may include an ID bezel through which an ID reader within the enclosure may read an ID card and a window, separate from the ID bezel, through which a camera within the enclosure may obtain an image.

In another arrangement according to any of the foregoing, the cargo rack may include a rail system connected to the inner hull and the outer hull and arranged to guide a telescoping motion of the inner hull within the outer hull.

In another arrangement according to any of the foregoing, the rail system may further include rails for guiding movement of the enclosure relative to an external fixture to which the rail system is fixed.

In another arrangement according to any of the foregoing, the enclosure may include an aperture arm fixed to either the inner hull or the outer hull and including an opening through which electrical cables may pass, the door including a slot and being positionable to close off an end of the enclosure without obstructing the opening of the aperture arm while the aperture arm is received in the slot.

In another arrangement according to any of the foregoing, the aperture arm may include an aperture portion through which the opening extends and receivable in the slot, the aperture portion being flexible or hinged at one end so as to enable widening of the opening when the aperture portion is not received in the slot.

In another arrangement according to any of the foregoing, the end of the inner hull may be a first end and the door is a first door closing off a second end of the inner hull and wherein the enclosure further includes a second door closing off an end of the outer hull.

In another arrangement according to any of the foregoing, the cargo rack may include feet arranged on a bottom surface of the enclosure and studs arranged on a top surface of the enclosure in a pattern matching the arrangement of the feet.

In another arrangement according to any of the foregoing, the studs may include posts extending upward, and the feet include bottom surfaces with receptacles therein.

In another arrangement according to any of the foregoing, a rack system may include including a plurality of cargo racks according to the foregoing examples.

In another arrangement according to any of the foregoing, the electronic system may include a programmable controller.

In another arrangement according to any of the foregoing, the cargo rack may include a swinging standoff mounted to the enclosure, the swinging standoff including a fastener plate, a frame, a hinge connecting the frame to the fastener plate, and a plurality of electrical connections connected to the frame.

In another arrangement according to any of the foregoing, the electrical connections may be modularly connectable and removable to the frame.

In another aspect, a server cabinet may include one or more removable cargo racks. Each cargo rack may include an enclosure with an interior adapted for retaining a server, an electronic system integrated with the enclosure and including a connection for receiving external power and an outlet through which the server may receive power, and an independent access control system configured to selectively permit or prevent opening or closing of the enclosure.

In another arrangement according to any of the foregoing, the enclosure may include at least two telescopic hulls.

In another arrangement according to any of the foregoing, each cargo rack may further include a rail system for guiding movement of the telescopic hulls relative to one another.

In another arrangement according to any of the foregoing, the telescopic hulls may include an outer hull and an inner hull and the enclosure includes inner conduits mounted inside the inner hull and outer conduits mounted inside the outer hull, the outer conduits being at least partially spaced from an interior surface of the outer hull such that the inner hull may pass between the outer conduits and the interior surface of the outer hull.

In another arrangement according to any of the foregoing, the outer conduits and inner conduits may be telescopically fitted together.

In another arrangement according to any of the foregoing, the electronic system may include a programmable controller.

In another arrangement according to any of the foregoing, the enclosure may include a door, a hull, and an aperture arm fixed to the hull and including an opening through which electrical cables may pass, the door including a slot and being positionable to close off an end of the hull without obstructing the opening of the aperture arm while the aperture arm is received in the slot.

DETAILED DESCRIPTION

Figure 1:
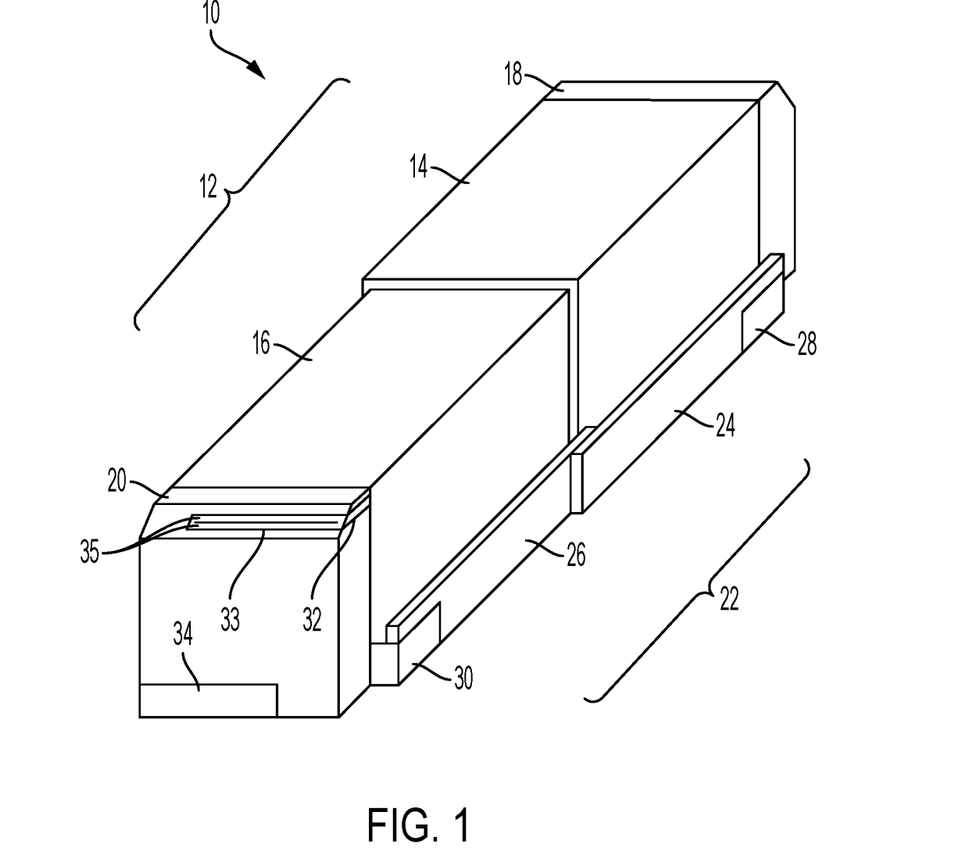
FIG. 1 is an oblique view of a cargo rack according to the present disclosure.

FIG. 1 illustrates a partial rack or cargo rack 10 for storing computing equipment, such as a server or a part of a server. Though illustrated as solid material, any component of cargo rack 10 may be constructed from perforated or woven material such as honeycomb metal mesh. Cargo rack 10 of the illustrated example includes a variable length enclosure 12. The interior of enclosure 12 may be configured to specifically be suitable for supporting and housing a specific type of computer hardware, such as a server, while the hardware operates. To that end, the interior of enclosure 12 may include any features that are included within known cabinets for the same type of computer hardware. Though not present in the illustrated example, enclosure 12 according to some arrangements may include slots on at least its lateral sides to allow portions of enclosed electronic equipment to extend out. For example, some known servers include lateral flanges to sit upon interior supports within a typical server cabinet, and enclosure 12 may have slots allowing the lateral flanges to extend out of the enclosure. Cargo racks 10 having enclosures 12 with such slots may have approximately or exactly the same lateral width as the received server or other electronic equipment, and may therefore rest upon the supports provided for such equipment within preexisting cabinets.

Enclosure 12 includes an outer hull 14 and an inner hull 16. Inner hull 16 fits closely and slidably within outer hull 14 to provide enclosure 12 with a telescoping construction and to prevent access to the interior of the enclosure except through an open end of either hull. Hulls 14, 16 may have lengthwise tongue-and-groove or dovetail features running along their length to maintain alignment between the hulls and further impede tampering. For example, grooves may run lengthwise along either or both of the inner surface of outer hull 14 and the outer surface of inner hull 16, and corresponding tongues or dovetails may protrude from and extend lengthwise along the other of the inner surface of the outer hull and the outer surface of the inner hull. Enclosure 12 may therefore be adjusted in length in order to fit either or both of the hardware stored within the enclosure or the space provided for the enclosure. If the installation permits, enclosure 12 may also be extended for ease of use when access to the stored electronics is needed, then shortened when access is no longer needed. Enclosure 12 further includes a posterior door 18, closing an end of outer hull 14 opposite from that in which inner hull 16 is disposed, and an anterior door 20 closing an end of the inner hull opposite from that which is disposed within the outer hull. The terms "posterior" and "anterior" here denote that cargo rack 10 of the illustrated example is intended to be installed within a conventional server cabinet such that anterior door 20 faces the cabinet's door and posterior door 18 faces the back of the cabinet. Anterior door 20 is therefore a front door that may typically be accessed with relative ease. However, any anterior or posterior features throughout this disclosure are reversible. For example, in other arrangements, outer hull 14 may provide a posterior portion of enclosure 12, and anterior door 20 may therefore be mounted to the outer hull.

Cargo rack 10 of the illustrated example also includes a rail system 22 to guide the telescoping of hulls 14, 16 relative to one another. Rail system 22 may be constructed according to the principles of any known type of sliding rail device. For example, rail system 22 may be generally alike to the systems commonly used in furniture drawers. Rail system 22 of the illustrated example includes a posterior rail 24 slidably connected to an anterior rail 26. A posterior bracket 28 connects posterior rail 24 to outer hull 14, and an anterior bracket 30 connects anterior rail 26 to inner hull 16. Though not visible from the perspective of FIG. 1, a second rail system may be present on the opposite side of cargo rack 10 to provide enclosure 12 with symmetrical guidance. In alternatives to the illustrated example, cargo rack 10 may be provided with rail systems in any other quantity, design, or location that a designer prefers, or with no rail system at all.

Though not illustrated, rail system 22 may include additional rails or other features to enable cargo rack 10 in its entirety to slide relative to any fixture within which the cargo rack is installed, such as a cabinet. In some arrangements, rail system 22 is specifically configured for suspension of cargo rack 10 within the type of rack or cabinet commonly used in network data centers. Rail system 22 therefore enables multiple cargo racks to be removably secured within a single such cabinet. Such suspending features may further be configured to allow for multiple cargo racks 10 to be separately installed adjacent to one another at the same height within a cabinet. In examples of cargo rack 10 without a rail system 22, such suspending features may be connected to the cargo rack otherwise, such as by mounting directly to enclosure 12.

Several variations on the illustrated construction of cargo rack 10 are possible. Outer hull 14, inner hull 16, posterior door 18, and anterior door 20 may each be monolithically formed, providing enclosure 12 with a simple, four-piece construction. Alternatively, any or all of hulls 14, 16 and doors 18, 20 may be constructed from multiple pieces according to preference or convenience. Moreover, posterior door 18 may be omitted altogether, and the posterior end of outer hull 14 may be closed, such that access to stored devices may only be possible from the anterior end of enclosure 12. Further, the variable length function of enclosure 12 may be provided by more than two telescoping hulls 14, 16, or by mechanisms other than telescoping hulls altogether. In yet further examples, enclosure 12 may be of fixed length, such as by construction from only one hull and one or two doors. Though the illustrated example of cargo rack 10 includes a variable length enclosure 12, any features described in the present disclosure with regard to the illustrated example of the cargo rack but not directly related to length-variability are equally applicable to examples with fixed length enclosures.

Cargo rack 10 according to the illustrated example includes functional features specifically suiting cargo rack 10 to storage of operating computer hardware, though in other arrangements these features may, individually or in any combination, differ in shape, size, number, or location from that which is illustrated, or may be absent altogether. For example, features shown as part of either door 18, 20, may instead be located on either hull 14, 16, or vice versa. Similarly, features shown or described with regard to either door 18, 20 may exist additionally or instead in the other door.

One such functional feature is aperture arm 32, which is fixedly connected to or formed with inner hull 16 and extends into anterior door 20. Aperture arm 32 includes an aperture portion 33 that provides an ingress or egress for cables, cords, wires, or other elongated connectors, with fibers and copper wires being specific examples, that connect to devices within enclosure 12. Aperture portion 33 may include a brush or rubber flap, or an opposed pair of brushes or rubber flaps 35, extending along a length of the aperture portion and partially obstructing an opening through the aperture portion such that the bristles or rubber would grip any connector extending through the opening. The grip provided by the bristles or flaps 35 would resist unintended movement of any connectors extending through the opening in aperture portion 33 while allowing connectors to be added, removed, or repositioned as necessary. The opening in aperture portion 33 may be made relatively narrow so as to enable connector ends to pass through the opening while making tampering with the contents of enclosure 12 through the opening difficult. Though aperture portion 33 could be integrated into either door 18, 20, the fixation of aperture arm 32 of the illustrated example to inner hull 16 enables connectors extending through aperture portion 33 to remain undisturbed when anterior door 22 is opened or removed. Aperture portion 33 may be flexible or hinged at one end so as to be widenable or openable when anterior door 20 is removed. Though not illustrated, a similar aperture arm may instead or in addition be fixed to outer hull 14 and extend into posterior door 18.

Figure 2A:
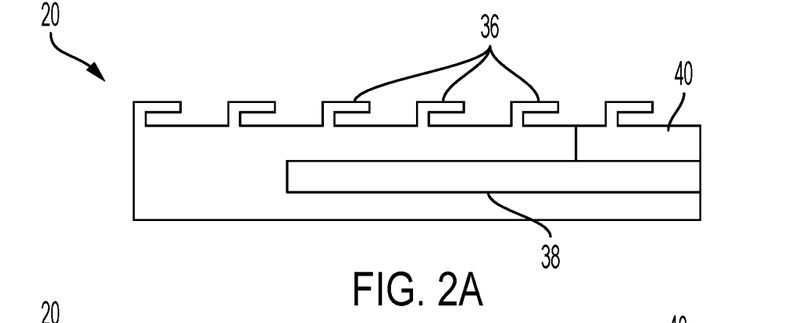
FIG. 2A is a top plan view of a door for the cargo rack of FIG. 1.
Figure 2B:
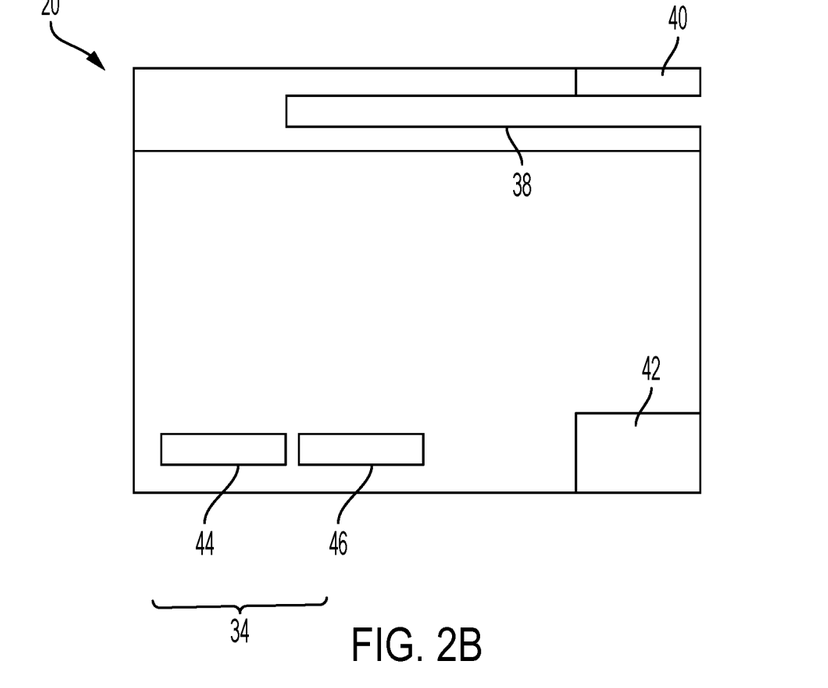
FIG. 2B is a front elevation view of the door of FIG. 2A.

FIGS. 2A and 2B illustrate features of anterior door 20, though the features shown and described with regard to the anterior door may instead or in addition be applied to posterior door 18. Anterior door 20 includes a slot 38 into which aperture arm 32 extends when the anterior door is closed on the end of inner hull 16. Slot 38 freely releases aperture arm 32 when anterior door 20 is opened or removed, so the interior of enclosure 12 may be accessed through the anterior door without disturbing any connectors disposed through aperture portion 33. Aperture arm 32 may or may not include tracks for sliding over edges of slot 38.

Anterior door 20 may also include a security interface 34, which in the illustrated example includes an ID bezel 44 and a window 46 for a camera. ID bezel 44 indicates where a user should place an identification card or badge for recognition by an ID reader that may be integrated with enclosure 12. A camera integrated with enclosure 12 may serve to ensure that the enclosure is only accessed by authorized personnel, and that work done on the contents of the enclosure remains confined to the authorized scope and timeframe. The camera may also be used to observe what hardware is removed from or added to enclosure 12 any time the enclosure is accessed. Window 46 may be shaped, sized, and located to limit the camera's field of view while anterior door 20 is closed upon inner hull 16 to a portion of the storage area relevant to cargo rack 10, thus preventing the observation of irrelevant activity in the area. In other arrangements, either or both of ID bezel 44 and window 46 may be absent, and in further arrangements security interface 34 may include other features for selectively granting access to enclosure 12, such as a keyhole, key pad, biometric scanner, or any other known hardware for receiving access credentials.

A lock 40 is controlled to open or close in response to inputs at security interface 34. Lock 40 may be, for example, a magnetic lock, or any other type of electronically controllable or analog lock. Lock 40 may include one or more tumblers or pins reversibly movable between a locked position, wherein the pins or tumblers prevent movement of anterior door 20 to inner hull 16 away from a position wherein the door closes off enclosure, and an unlocked position, wherein the pins or tumblers permit rotation of the anterior door or removal of the anterior door from the inner hull. Lock 40 thus includes features mounted or integral to anterior door 20 and features mounted or integral to inner hull 16. In the unlocked position, the pins or tumblers are retracted to a position at which they do not prevent anterior door 20 from moving relative to inner hull 16, and in the locked position the pins or tumblers extend to be received in corresponding recesses in the opposing portion of the lock. Lock 40 may be configured as a "fail closed" or "fail open" lock. If configured to "fail closed," lock 40 will prevent opening of anterior door 20 and access to enclosure 12 when cargo rack 10 loses power, which would add another layer of security.

A lock controller 42 may be associated with lock 40. Lock controller 42 may be configured to receive inputs regarding the presence or absence of authorized credentials presented at security interface 34 and to move lock 40 between the locked and unlocked positions accordingly. Alternatively, lock 40 may be controlled directly by a central controller for cargo rack 10 overall. In order to simplify construction and wiring, lock controller 42 all electronic portions of lock 40 may be mounted to inner hull 16. If electronic portions of lock 40 and all electronics associated with security interface 34 are either mounted to inner hull 14 or wirelessly powered by features mounted to the inner hull, anterior door 20 may be simply constructed and freely removable from enclosure 12.

Anterior door 20 may be connected to inner hull 16 by any type of hinge or releasable connection. In the illustrated example, anterior door 36 includes several hooked pins 36 receivable in corresponding features of inner hull 16.

Figure 3:
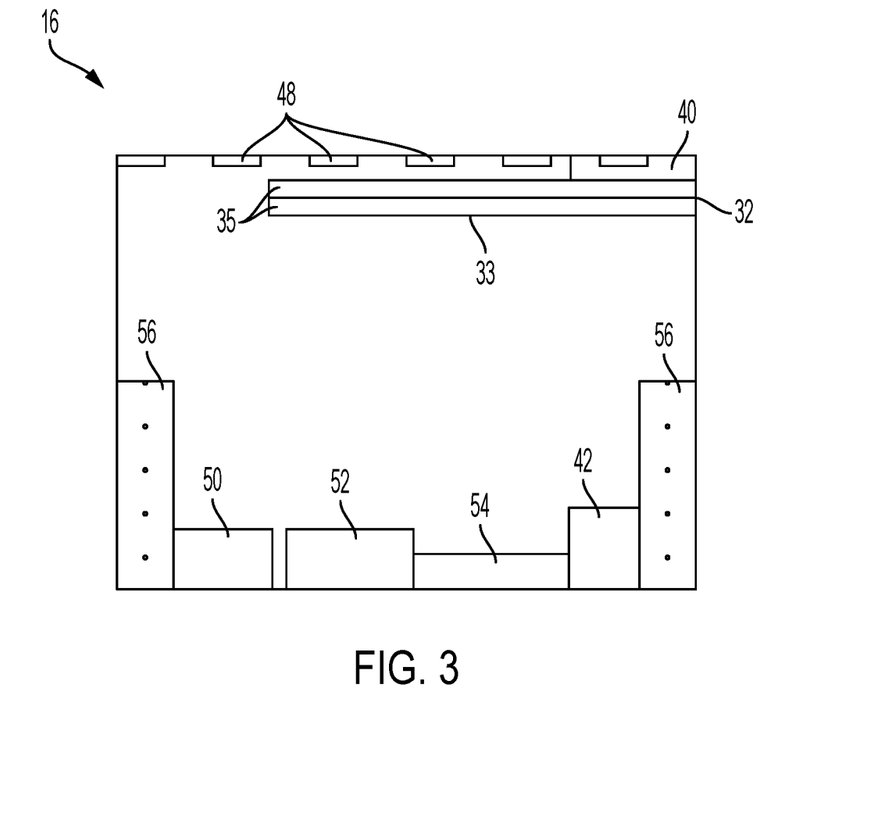
FIG. 3 is a front elevation view of a portion of the cargo rack of FIG. 1 without the door of FIG. 2A.

Turning to FIG. 3, inner hull 16 of the illustrated example includes hoops 48 for receiving hooked pins 36. When unlocked, anterior door 20 may therefore rotated about a hinge created by hooked pins 36 and hoops 48, or the anterior door may be translated to remove the hooked pins from the hoops to free the anterior door from inner hull 16. The same functionality may be achieved by mounting hooked pins 36 to inner hull 16 and hoops 48 to anterior door 20.

In the illustrated example, electronics associated with security interface 44 of anterior door 20 are mounted to inner hull 16. These include an ID reader 50, such as an RFID or HID scanner, configured to read an ID card or badge positioned at ID bezel 44, and a camera 52. However, these electronics could instead be mounted directly to anterior door 20. A main controller 54 is also mounted to inner hull 16. Security interface 34, the associated electronics such as ID reader 50 and camera 52, lock 40 and, if present, lock controller 42 collectively provide an access control system that selectively permits or prevents opening of enclosure 12.

Perforated flanges 56 extend along opposed sides of inner hull 16 according to the illustrated arrangement, though in other arrangements such flanges may be different in number, location, or size. Perforations such as those in flanges 56 facilitate fastening of other features, such as anterior brackets 30, to inner hull 16.

Each of the features, components, and interactions described above with regard to anterior door 20 and inner hull 16 may apply additionally or instead to posterior door 18 and outer hull 14.

Figures 4, 5A, 5B:
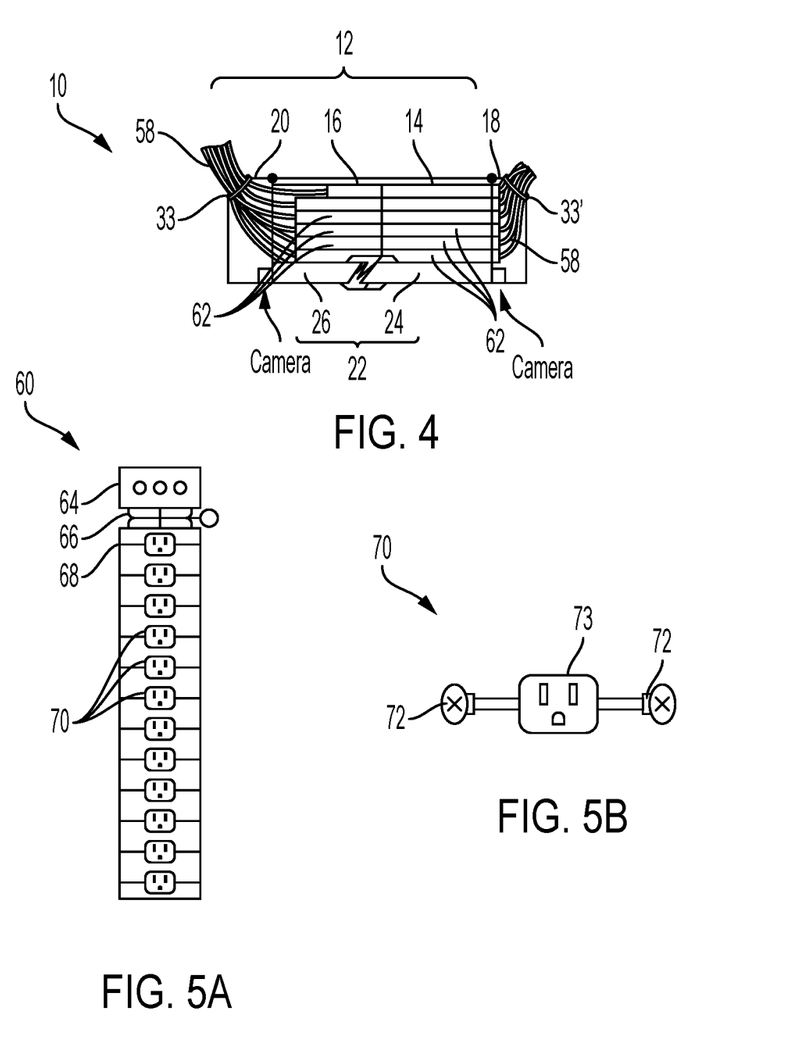
FIG. 4 is a side elevation cross-sectional view of the cargo rack of FIG. 1.
FIG. 5A is a top plan view of a standoff that may be mounted within the cargo rack of FIG. 1.
FIG. 5B illustrates a module compatible with the standoff of FIG. 5A.

As shown in FIG. 4, cargo rack 10 may be wired in a front-to-back manner, with connectors 58, such as wires, cords, or cables, extending into and out of aperture portions 33, 33' at anterior and posterior ends of enclosure 12. Connectors 58 may be contained within conduits 62 mounted to interior surfaces of outer hull 14 and inner hull 16. Conduits 62 mounted within outer hull 62 may only be connected to the outer hull near the posterior end of enclosure 12 so as not to obstruct telescoping of inner hull 14 within the outer hull. Conduits 62 mounted to outer hull 14 may therefore be spaced from an interior surface of the outer hull along at least part of their length such that inner hull 16 may pass between the interior surface of the outer hull and the conduits mounted to the outer hull while the conduits mounted to the inner hull telescope with the conduits mounted to the outer hull. The telescopic fit or arrangement of conduits 62 may be such that either the conduits mounted to outer hull 14 or inner hull 16 are smaller and may therefore be received within the conduits mounted to the other hull. In another example, the above mentioned tongues or dovetails may act as conduits 62 by including tubes within which wires or other connectors may extend.

FIG. 5A illustrates a swinging standoff 60 that may be mounted inside enclosure 12 to any of outer hull 14, inner hull 16, posterior door 18, and anterior door 20, such as to perforated flanges 56 or other fastener holes thereon. Any number of such standoffs 60 may be mounted within enclosure 12. Standoff 60 includes a fastener plate 64, which is perforated to facilitate fastening, a hinge 66, and a frame 68. Hinge 66 enables frame 68 to swing relative to whichever feature fastener plate 64 is fastened to so as to provide convenient access to any area within enclosure 12. In the illustrated arrangement, standoff 60 is modular, and frame 70 retains several removable modules 70, though in other arrangements, the standoff may simply be constructed with several electrical sockets, plugs, or other connectors irremovably connected to the frame.

Standoffs 60 may be mounted within cargo rack 10 with respective fastener plates 64 mounted at or near either the anterior end or posterior end of enclosure 12. Hinges 66 enable frames 68 to lie flat against either side, either door, or the top or bottom of enclosure 12, or to swing away from any side of the enclosure to allow a worker to access both the front and the back of the frame.

A module 70 for use with standoff 60 is illustrated in FIG. 5B. Module 70 includes contacts 72 for establishing electrical and mechanical connection between an active component 73 of the module and frame 68. Active component 73 of the illustrated example is an electrical socket, but in other examples the active component may be, for example, a plug, another type of electrical connector, or any feature that might be useful within enclosure 12.

Figure 6:
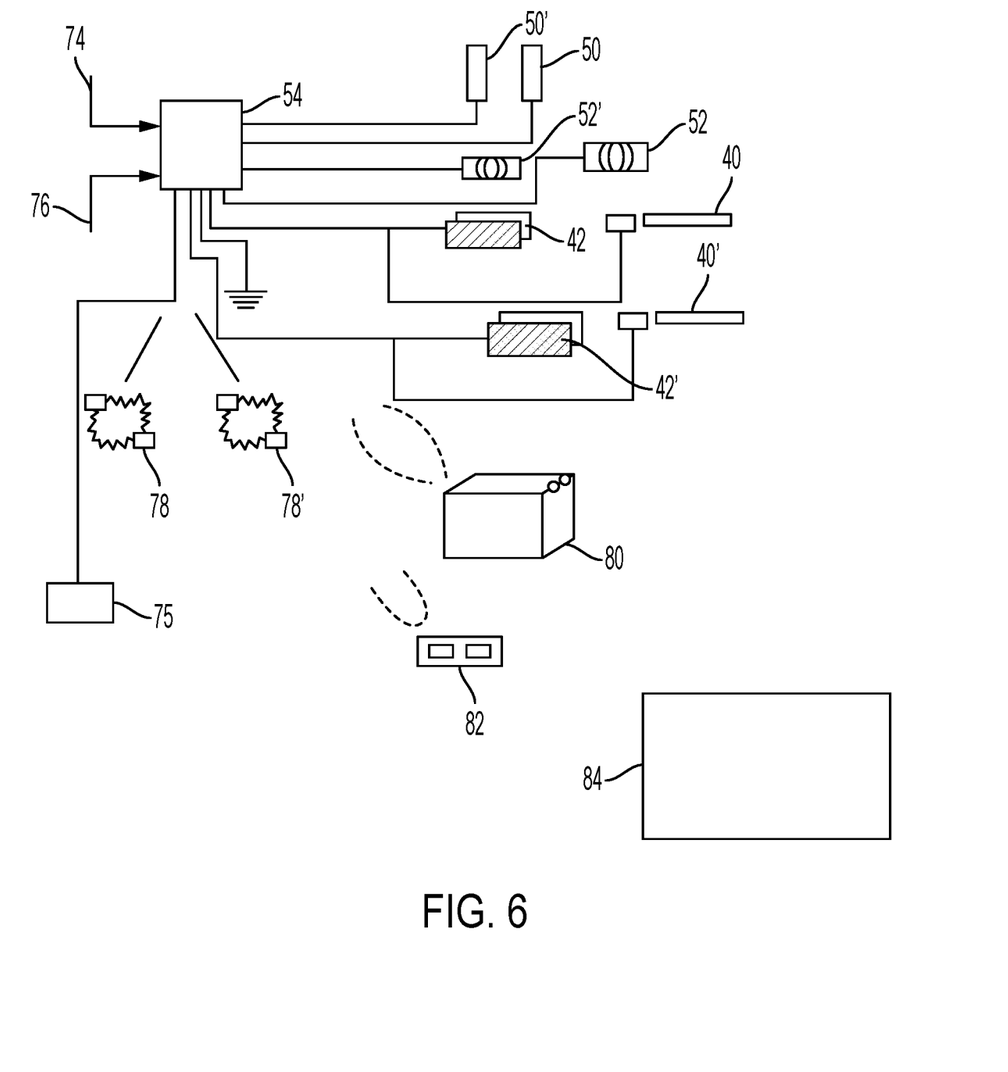
FIG. 6 is a partial schematic of an electronic system that may be incorporated with the cargo rack of FIG. 1.

FIG. 6 diagrams a possible arrangement of electronic components that may be integrated with cargo rack 10, though any one or any combination of the components in FIG. 6 may be absent from other arrangements of the cargo rack or included in different quantities. In the illustrated arrangement, a main controller 54 is grounded and receives input from and governs the various other electronic hardware integrated with cargo rack 10. Main controller may be, for example, any kind of small programmable computer, such as a Raspberry Pi or similar device. The electronic hardware connected to main controller 54 includes lock 40, lock controller 42, ID reader 50, and camera 52 as described above with regard to the anterior end of enclosure 12, as well as another lock 40', lock controller 42', ID reader 50', and camera 52' that may be included at the posterior end of the enclosure. Main controller 54 is also connected to an external power source 74, a network connection 76, tamper sensors 78, 78', which may, for example, be mounted respectively at or near the posterior and anterior ends of enclosure 12, a battery 80, which may optionally be configured only to power the locks 40, 40' and lock controllers 42, 42', a USB port 82, which may be part of security interface 34, and a Bluetooth or NFC transceiver 84. In various arrangements, the computing device, such as a server, stored within enclosure 12 may either be connected directly to external power source 74 or may receive power through main controller 54 at a controlled outlet 75. Though not specifically illustrated, one or more fans may optionally also be mounted to cargo rack 10, and the fans may also be connected to main controller 54. The fans may be placed to direct airflow in a specific direction through enclosure 12, such as from front to back or from back to front.

Figure 7:
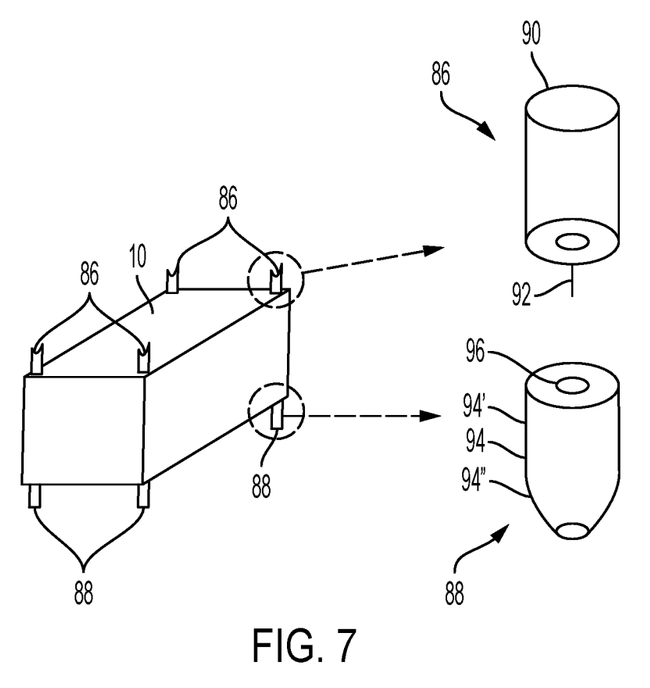
FIG. 7 is an oblique view of a cargo rack such as that shown in FIG. 1 with a support system provided thereon and close views of two elements of the support system.

FIG. 7 illustrates an optional stacking system that may be applied to cargo rack 10 for allowing the cargo rack to stand freely without a cabinet or to elevate the cargo rack within a cabinet and to enable multiple cargo racks to be stacked upon one another with some space in between. Stacking system includes feet 88 and studs 86, though the studs themselves are optional such that the feet may be employed without any studs. In the illustrated example, studs 86 are cylinders 90 and feet 88 are tapered bodies 94, though studs and feet of other examples may be of any shape. Tapered bodies 94 include a cylindrical barrel 94' and a frustoconical portion 94" tapering from the barrel to a narrow end of the tapered body.

Feet 88 are mounted to the bottom of cargo rack 10, and a corresponding arrangement of studs 86 are mounted to the top of the cargo rack. The elevation provided by feet 88 protects cargo rack 10 from some flooding or other hazards that may spread along the ground. Feet 88 and studs 86 may be present in any number, and may be mounted in any combination to outer hull 14, inner hull 16, posterior door 18, and anterior door 20. However, feet 88 are typically applied in a number and arrangement such that cargo rack 10 may rest stably on the feet. Further, if studs 86 are of a type intended for receipt in feet 88 of another cargo rack 10, the studs are provided in an arrangement aligning with the receiving set of feet and in a quantity that does not exceed the quantity of receiving feet.

Feet 88 and studs 86 may each be simple solid bodies of material such as rubber, plastic, metal, or another type of material suitable for supporting cargo racks 10. However, in the illustrated example, each foot 88 includes a receptacle 96 in a side of the foot opposite from cargo rack 10, and each stud 86 includes a post 92 extending from a side of cylinder 90 opposite from the cargo rack. Posts 92 may each be received in a receptacle 96 of a corresponding foot 88 to align stacked cargo racks 10 relative to one another. Further to the illustrated example, posts 92 are externally threaded and receptacles 96 are internally threaded. Either or both of studs 86 and feet 88 may be rotatably mounted to cargo rack 10 such that posts 92 may be threaded or unthreaded from receptacles 96, enabling reversible fastening of one cargo rack to another. However, in other arrangements, posts 92 may be unthreaded.

Figure 8A:
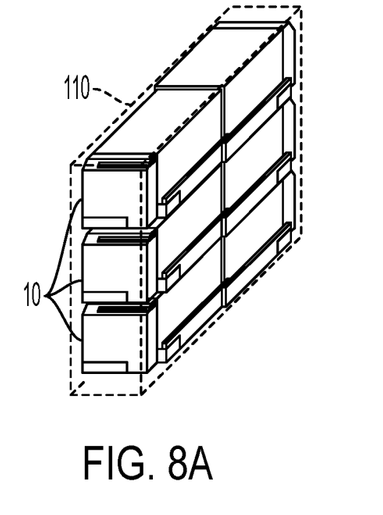
FIGS. 8A and 8B are oblique views of a cabinet containing multiple of the cargo racks of FIG. 1.
Figure 8B:
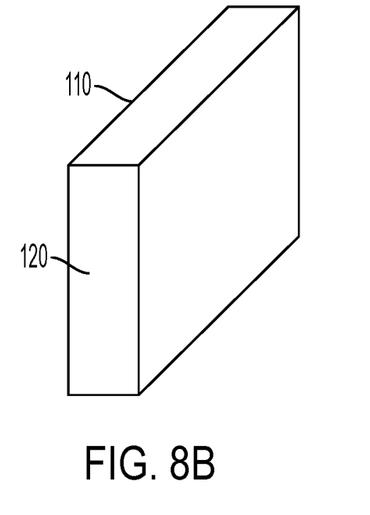

The foregoing features of cargo rack 10 are compatible with several storage configurations. One such configuration is a cabinet 110, which may be generally alike to known cabinets for servers or other computing equipment except for the new features described herein. Rail systems 22 of each cabinet may sit upon existing flanges, rails, or other supports provided within cabinet 110 for the purpose of supporting the server or other computer hardware. Cabinet 110 includes a main door 120 through which cargo racks 10 may be accessed. Main door 120 may include one of or any combination of the features described above with regard to anterior door 20, except adapted to fit cabinet 110 overall. Specifically, main door 120 may include a lock, which may optionally be a fail closed lock. The lock may be controlled in response to security electronics, which may be either or both of a camera and an ID reader, either or both of which may be stored within cabinet 110. A security interface may be provided on either or both of main door 120 and cabinet 110 itself. The security interface may include, for example, either or both of a window through which the camera may obtain an image and a bezel at which an ID card or badge may be presented for reading by the ID reader. Such security at the cabinet level provides another layer of protection against unexpected lock failures or active tampering.

Figure 9A:
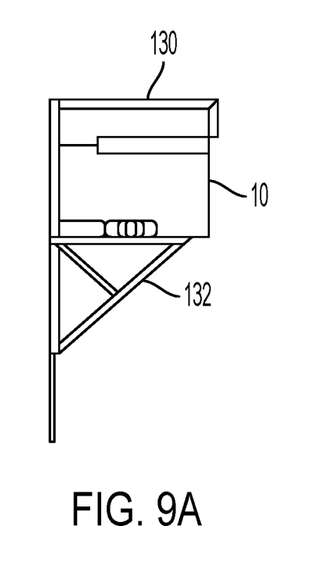
FIGS. 9A and 9B are end elevation views of a wall mounting system for the cargo rack of FIG. 1.
Figure 9B:
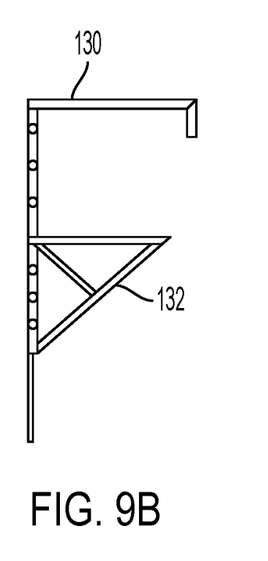
Figure 9C:
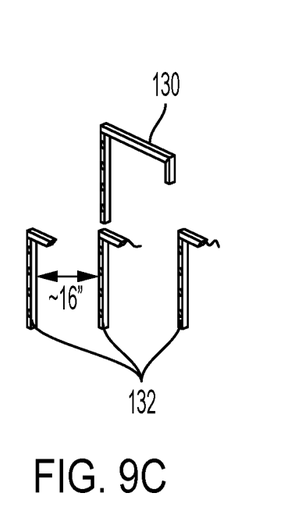
FIG. 9C is an oblique view of the wall mounting system of FIGS. 9A and 9B.

FIGS. 9A-9C illustrate a wall-mount configuration for cargo rack 10, including buttress brackets 132 and a hook bracket 130. Buttress brackets 132 extend from a wall to support the weight of cargo rack 10 and its contents, while hook bracket 130 extends over top and at least partially down at least one side of the cargo rack, or both sides as illustrated. By extending down the side of cargo rack 10 opposite the wall, hook bracket 130 prevents cargo rack 10 from sliding laterally off of buttress brackets 132. By extending between cargo rack 10 and the wall, hook bracket 130 spaces the cargo rack from the wall.

Because buttress brackets 132 must support the weight of cargo rack 10, more buttress brackets may be needed than hook brackets 130. For example, a cargo rack 10 holding a typical server might be supported by three buttress brackets 132 spaced apart by 16 inches from one another and retained by one hook bracket 130 as in the arrangement illustrated in FIG. 9C. However, the number and spacing of buttress brackets 132 and hook brackets 130 used may depend on the size and construction of the brackets themselves, the weight of the cargo rack 10 and contained equipment, the structure of the supporting wall, and installer preference.

Figure 10A:
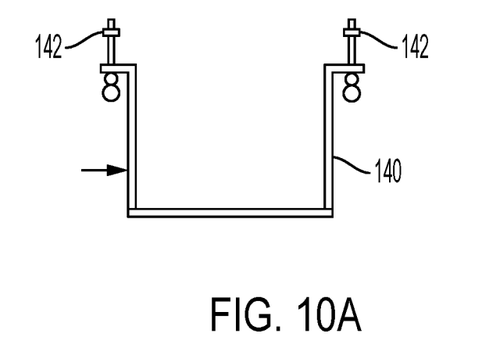
FIG. 10A is a front elevation view of a ceiling bracket for retaining the cargo rack of FIG. 1.
Figure 10B:
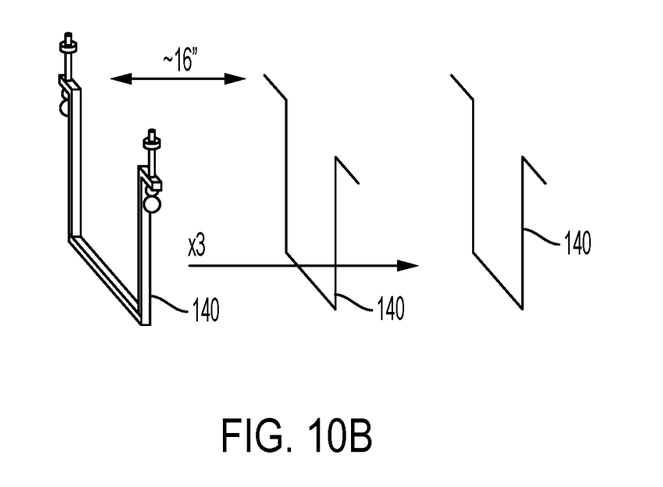
FIG. 10B is an oblique view of an arrangement of the ceiling brackets of FIG. 10A.

FIGS. 10A and 10B illustrate hanging brackets 140 for ceiling mounting cargo rack 10. In the illustrated example, each hanging bracket has a squared-off "U" shape conforming at least approximately to the bottom and sides of one portion along the length of cargo rack 10. Each hanging bracket 140 is fixed to the ceiling with fasteners or chains 142. The number and spacing of hanging brackets 140 used for ceiling mounting cargo rack 10 can vary according to the structure of the supporting ceiling or any of the factors described above with regard to buttress brackets 132. As with buttress brackets 132, hanging brackets 140 according to one example may be arranged in a group of three, spaced 16 inches apart, to support a cargo rack 10 containing a typical server.

Figure 11:
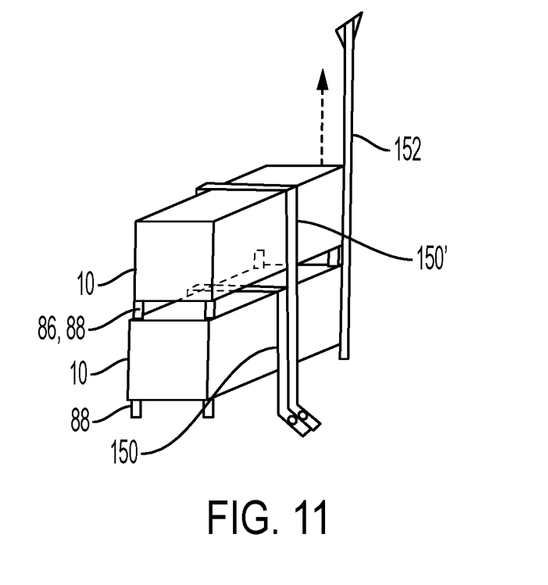
FIG. 11 is an oblique view of a stacking system for use with the cargo rack of FIG. 1.

FIG. 11 illustrates two cargo racks 10 retained by lifting brackets 150, 150'. Lifting brackets 150, 150' may be used with or without posts 86 and feet 88 as illustrated. Lifting brackets 150, 150' of the illustrated example are inverted, squared-off "U" shaped structures that may be made of any sufficiently strong and durable material, such as, for example, metal. Each lifting bracket 150, 150' extends over a cargo rack 10 to support some or all of the weight of another cargo rack that may be stacked thereon. Each lifting bracket 150, 150' may be fastened directly to the floor, but extend to a different height so as to reach over a different number of cargo racks 10. For example, as shown, lifting bracket 150 is tall enough to extend only over one cargo rack 10, while lifting bracket 150' is tall enough to extend over a second cargo rack that is stacked on top of the first. In the same manner, stacks of more cargo racks 10 may include lifting brackets taller than those shown in FIG. 11, up to a maximum height corresponding to the number of cargo racks in the stack. Multiple lifting brackets 150, 150' may be used at each level to provide additional support, if an installer prefers. Optionally, a vertical conduit 152 may be used with lifting brackets 150, 150' to protect the wires or other connectors extending from cargo racks 10 stacked with the lifting brackets. Such vertical conduit 152 may also be used without lifting brackets 150, 150'.

Figure 12:
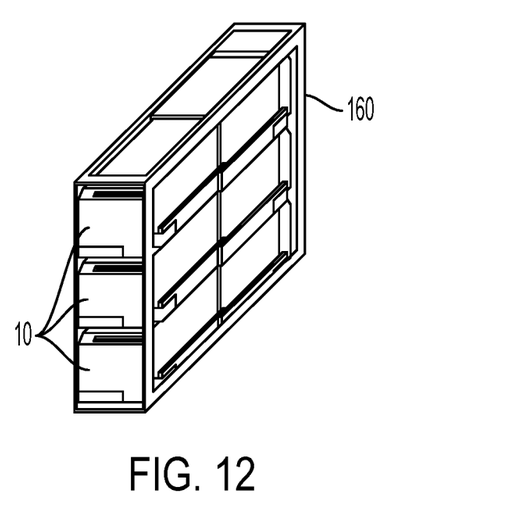
FIG. 12 is an oblique view of a skeletal cabinet for storage of the cargo rack of FIG. 1.

FIG. 12 illustrates a skeletal cabinet 160 usable with cargo racks 10. Because each cargo rack 10 may be self-contained, the cargo racks have less need for the degree of enclosure provided by typical server cabinets. Skeletal cabinet 160 may be a relatively simple frame of material, such as metal or other sufficiently strong and rigid material, providing internal supports for cargo racks 10 and creating the general shape and dimensions of a typical cabinet, but with fewer or none of the side, front, back, top, or bottom panels such cabinets usually include. Skeletal cabinet 160 may therefore provide free access to cargo racks 10.

Although the concept herein has been described with reference to particular examples, it is to be understood that these examples are merely illustrative of the principles and applications of the present concept. It is therefore to be understood that numerous modifications may be made to the illustrative examples and that other arrangements may be devised without departing from the spirit and scope of the present concept as defined by the appended claims.

The invention claimed is:

1. A telescopic server cargo rack comprising:
an enclosure including:
an inner hull and an outer hull in which an end of the inner hull is telescopically received; and
a door closing an end of the enclosure; and
an electronic system mounted within the enclosure and including a power outlet,
wherein the enclosure includes an aperture arm fixed to either the inner hull or the outer hull and including an opening sized for electrical cables to pass therethrough.

2. The cargo rack of claim 1, wherein the electronic system further includes an access control system that selectively locks or unlocks the door.

3. The cargo rack of claim 1, wherein the access control system further includes a security interface integrated with the door and through which access credentials may be presented to prompt the access control system to unlock the door.

4. The cargo rack of claim 1, wherein the security interface includes an ID bezel through which an ID reader within the enclosure may read an ID card and a window, separate from the ID bezel, through which a camera within the enclosure may obtain an image.

5. The cargo rack of claim 1, comprising a rail system connected to the inner hull and the outer hull and arranged to guide a telescoping motion of the inner hull within the outer hull.

6. The cargo rack of claim 5, wherein the rail system further comprises rails for guiding movement of the enclosure relative to an external fixture to which the rail system is fixed.

7. The cargo rack of claim 1, wherein the door includes a slot and is positionable to close off an end of the enclosure without obstructing the opening of the aperture arm while the aperture arm is received in the slot.

8. The cargo rack of claim 7, wherein the aperture arm includes an aperture portion through which the opening extends and receivable in the slot, the aperture portion being flexible or hinged at one end so as to enable widening of the opening when the aperture portion is not received in the slot.

9. The cargo rack of claim 1, wherein the end of the inner hull is a first end and the door is a first door closing off a second end of the inner hull and wherein the enclosure further includes a second door closing off an end of the outer hull.

10. The cargo rack of claim 1, wherein the electronic system includes a programmable controller.

11. The cargo rack of claim 1, comprising a swinging standoff mounted to the enclosure, the swinging standoff including a fastener plate, a frame, a hinge connecting the frame to the fastener plate, and a plurality of electrical connections connected to the frame.

12. The cargo rack of claim 11, wherein the plurality of electrical connections is modularly connectable and removable to the frame.

13. A telescopic server cargo rack comprising:
an enclosure including:
an inner hull and an outer hull in which an end of the inner hull is telescopically received; and
a door closing an end of the enclosure;
an electronic system mounted within the enclosure and including a power outlet, and
feet arranged on a bottom surface of the enclosure and studs arranged on a top surface of the enclosure in a pattern matching the arrangement of the feet.

14. The cargo rack of claim 13, wherein the studs include posts extending upward, and the feet include bottom surfaces with receptacles therein.

15. A server cabinet comprising one or more removable cargo racks, each cargo rack comprising:
an enclosure with an interior adapted for retaining a server;
and an independent electronic system integrated with the enclosure and including:
a connection for receiving external power and an outlet through which the server may receive power; and
an independent access control system configured to selectively permit or prevent opening or closing of the enclosure,
wherein the enclosure includes a door, a hull, and an aperture arm fixed to the hull and including an opening an opening sized for electrical cables to pass therethrough.

16. The server cabinet of claim 15, wherein the enclosure includes at least two telescopic hulls.

17. The server cabinet of claim 15, wherein each cargo rack further includes a rail system for guiding movement of the telescopic hulls relative to one another.

18. The server cabinet of claim 16, wherein the telescopic hulls include an outer hull and an inner hull and the enclosure includes inner conduits mounted inside the inner hull and outer conduits mounted inside the outer hull, the outer conduits being at least partially spaced from an interior surface of the outer hull such that the inner hull may pass between the outer conduits and the interior surface of the outer hull.

19. The server cabinet of claim 15, wherein the electronic system includes a programmable controller.

20. The server cabinet of claim 15, wherein the door includes a slot and is positionable to close off an end of the hull without obstructing the opening of the aperture arm while the aperture arm is received in the slot.

* * * * *